United States Patent
Kao (12)

(10) Patent No.: US 6,442,816 B1
(45) Date of Patent: Sep. 3, 2002

(54) TOOL FOR MOUNTING CLIP TO CPU SOCKET

(75) Inventor: Tien Lu Kao, Cypress, CA (US)

(73) Assignee: FoxConn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/746,593

(22) Filed: Dec. 21, 2000

(51) Int. Cl.7 .............................................. B23P 11/00
(52) U.S. Cl. ................................................. 29/243.56
(58) Field of Search ........................... 29/243.56, 278, 29/270, 426.5, 426.6, 229, 450, 451, 267, 239; 254/131

(56) References Cited

U.S. PATENT DOCUMENTS 6,178,611 B1 * 1/2001 Boe ........................ 29/243.56

\* cited by examiner

Primary Examiner—Robert C. Watson
(74) Attorney, Agent, or Firm—Wei Te Chung

(57) ABSTRACT

A tool (100) for mounting a clip (60) to a CPU socket (90) includes a body (110), and a pair of feet (130) attached on opposite sides of the body. The body includes a handle (112), a presser (114) for downwardly pressing the clip, and a finger (116) with a claw (120) for catching a bar (70) of a leg (62) of the clip thereby allowing the body to outwardly rotate the leg. The handle defines two first holes (118) for extension of two pins (140) therethrough. Each foot includes a connection portion (132) and a toe (134). Two second holes (136) are defined in each foot, for retaining ends of the pins. The pins thereby attach the feet to the handle. The toes abut the socket, thereby allowing the tool to be safely rotated in contact with the socket.

11 Claims, 6 Drawing Sheets

TOOL FOR MOUNTING CLIP TO CPU SOCKET

BACKGROUND OF THE INVENTION

1. Field of the Invention

The present invention relates to a tool, and particularly to a tool for mounting a clip to a central processing unitsocket.

2. Related Art

A heat sink placed in contact with a central processing unit (CPU) transfers heat away from the CPU through conduction. Oftentimes, a heat sink is secured to a CPU socket by a clip.

FIG. 6 shows a conventional tool 50 being used to attach a clip 10 to a CPU socket 40, thereby securing a heat sink 30 on a CPU (not labeled). The clip 10 comprises a first leg 11 and a second leg 12. The first leg 11 defines a first opening 14 for engaging with a corresponding catch 42 of the socket 40, and a second opening 16 above the first opening 14. A bar 18 is formed between the first opening 14 and the second opening 16.

In assembly, the second leg 12 is engaged with the corresponding catch 42 (not shown) of the socket 40. The tool 50 is reclined on the clip with a head 52 of the tool 50 being inserted into the second opening 16 and abutting against the bar 18. The tool 50 is then rotated. Consequently, the first leg 11 is moved outwardly and downwardly. Once the first leg 11 has slid over the corresponding catch 42 of the socket 40, rotation of the tool 50 is stopped. The first opening 14 of the first leg 11 then engages with the catch 52.

However, the tool 50 often easily slips out-of either the second or first openings 16, 14 by accident, and strikes a motherboard on which the socket 40 is mounted.

It is strongly desired to provide a tool for mounting a clip to a CPU socket which overcomes the above problems encountered in the prior art.

SUMMARY OF THE INVENTION

Accordingly, an object of the present invention is to provide a tool for, readily mounting a clip to a CPU socket, and for preventing accidental damage to a motherboard on which the socket is mounted.

To achieve the above-mentioned object, a tool for mounting a clip to a CPU socket in accordance with the present invention comprises a body and a pair of feet attached on opposite sides of the body. The body comprises a handle, a presser for downwardly pressing the clip, and a finger with a claw for catching a bar of a leg of the clip thereby allowing the body to outwardly rotate the leg. The handle defines two first holes for extension of two pins therethrough. Each foot comprises a connection portion and a toe. Two second holes are defined in each foot, for retaining ends of the pins. The pins thereby attach the feet to the handle. The toes abut the socket, thereby allowing the tool to be safely rotated in contact with the socket.

Other objects, advantages and novel features of the present invention will be drawn from the following detailed description of preferred embodiment of the present invention with reference to the attached drawings, in which:

DESCRIPTION OF THE PREFERRED EMBODIMENT

Figure 1:
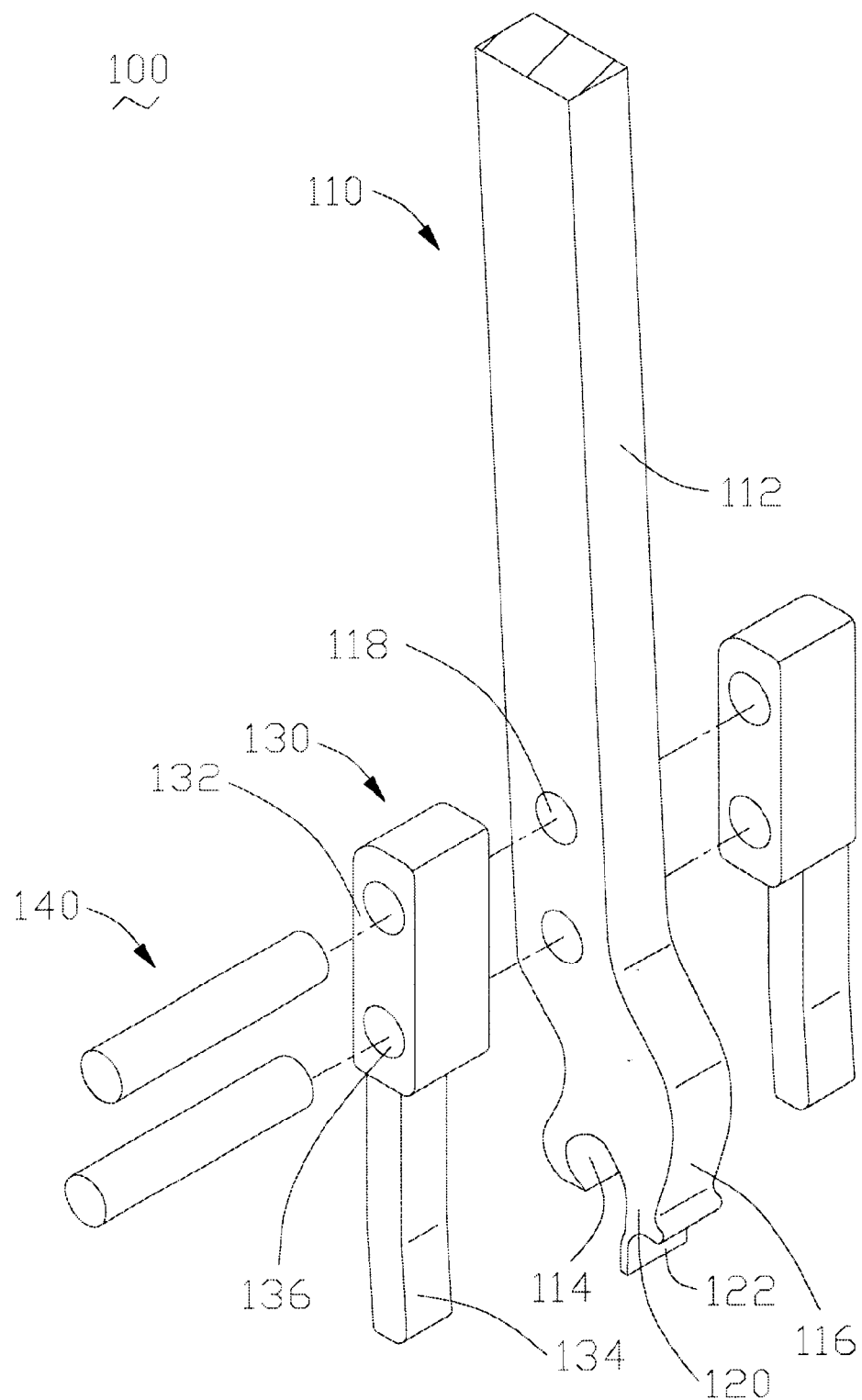
FIG. 1 is an exploded view of a tool in accordance with the present invention.
Figure 2:
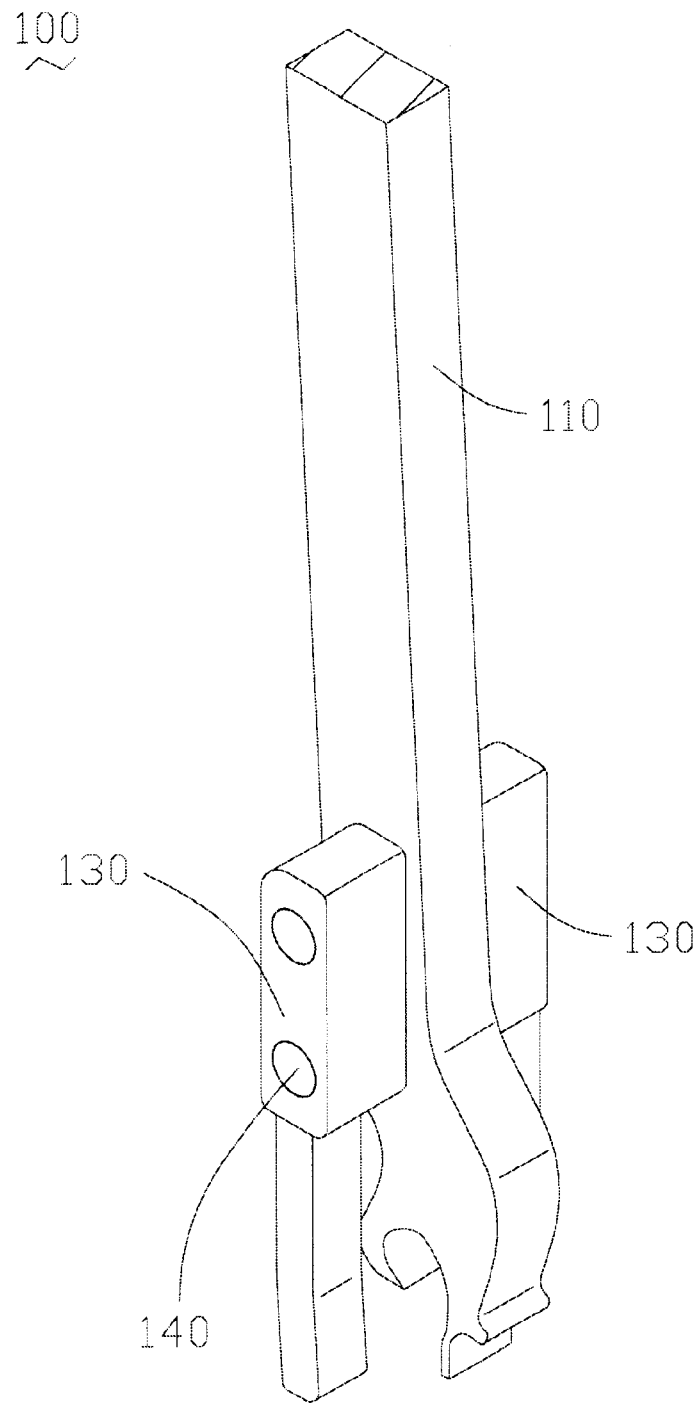
FIG. 2 is an assembled view of FIG. 1.

Referring to FIGS. 1 and 2, a tool 100 in accordance with the present invention comprises a body 110, a pair of feet 130 and a pair of pins 140 attaching the feet 130 to opposite sides of the body 110.

The body 110 comprises an elongate handle 112, a presser 114 and a finger 116. A pair of first through holes 118 is defined in the handle 112 near a lowerend thereof, for extension of the pins 140 therethrough. The presser 114 is arcuate, and extends from the lower end of the handle 112. The finger 116 extends from the lower end of the handle 112. The finger 116 opposes and spaces from the presser 114. A claw 120 is formed on a free end of the finger 116. The claw 120 has a hook 122.

Each foot 130 comprises a connection portion 132, and a toe 134 depending from the connection portion 132. A pair of second through holes 136 is defined in the connection portion 132, corresponding to the first through holes 118 of the handle 112.

In assembly of the tool 100, the pins 140 are extended through the second through holes 136 of one foot 130, through the first through holes 118 of the handle 112, and finally into the second through holes 136 of the other foot 130. Thus the tool 100 is ready for use as a single unit.

Figure 3:
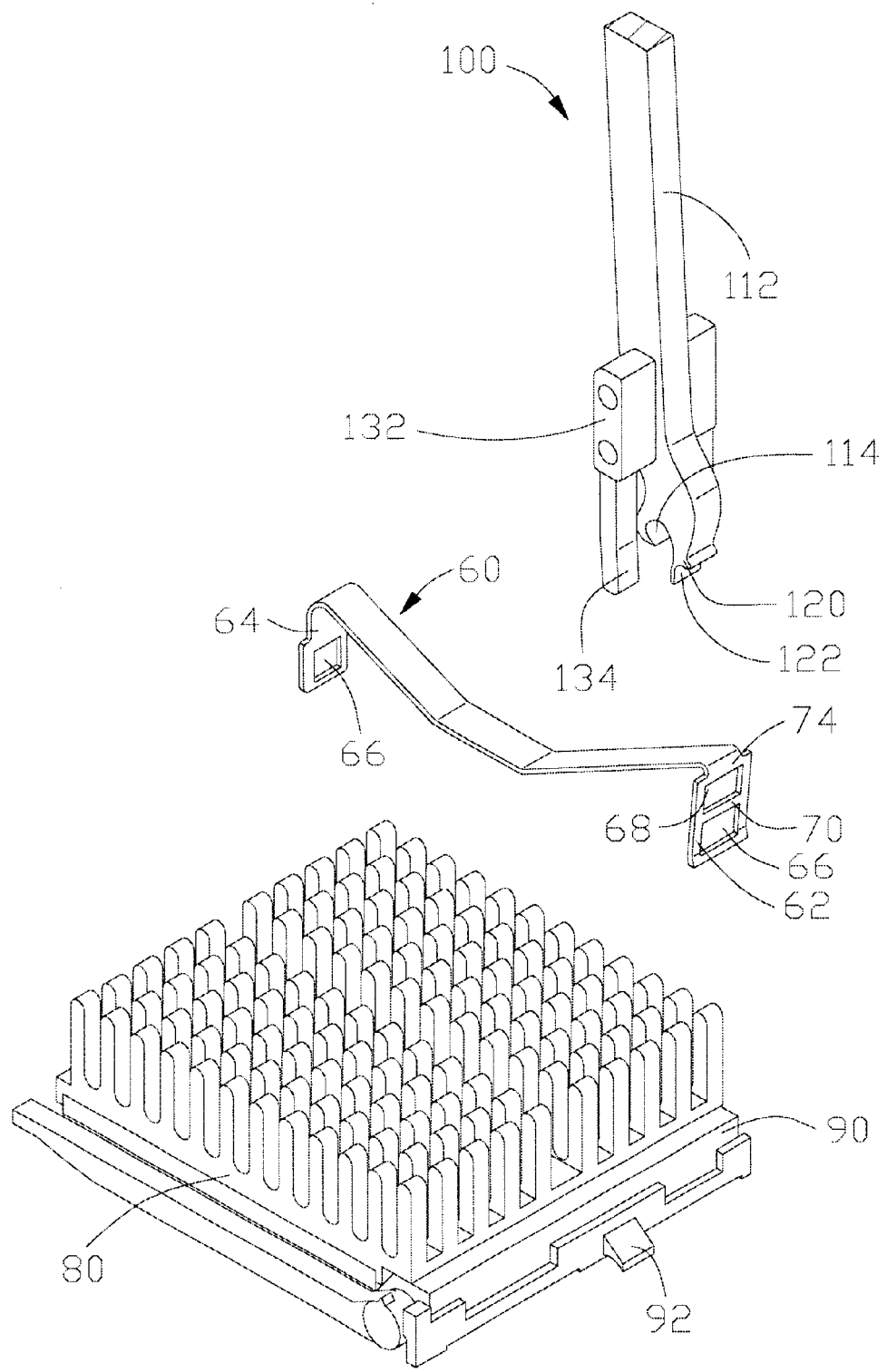
FIG. 3 is an exploded view of a heat sink mounted on a CPU socket, a clip, and the tool of FIG. 2.
Figure 4:
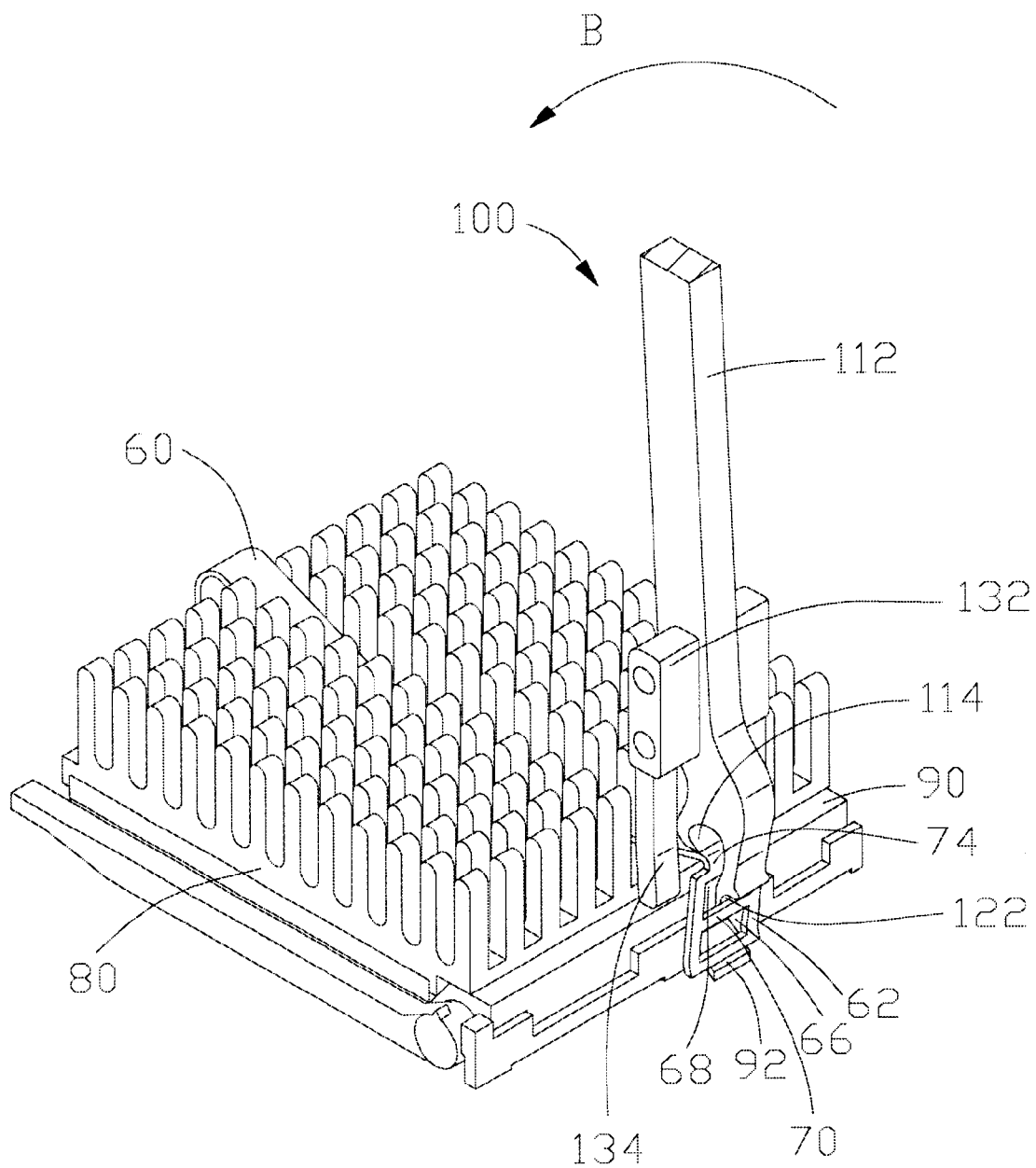
FIG. 4 is a partly assembled view of FIG. 3, showing the tool of FIG. 2 mounting the clip to the socket.
Figure 5:
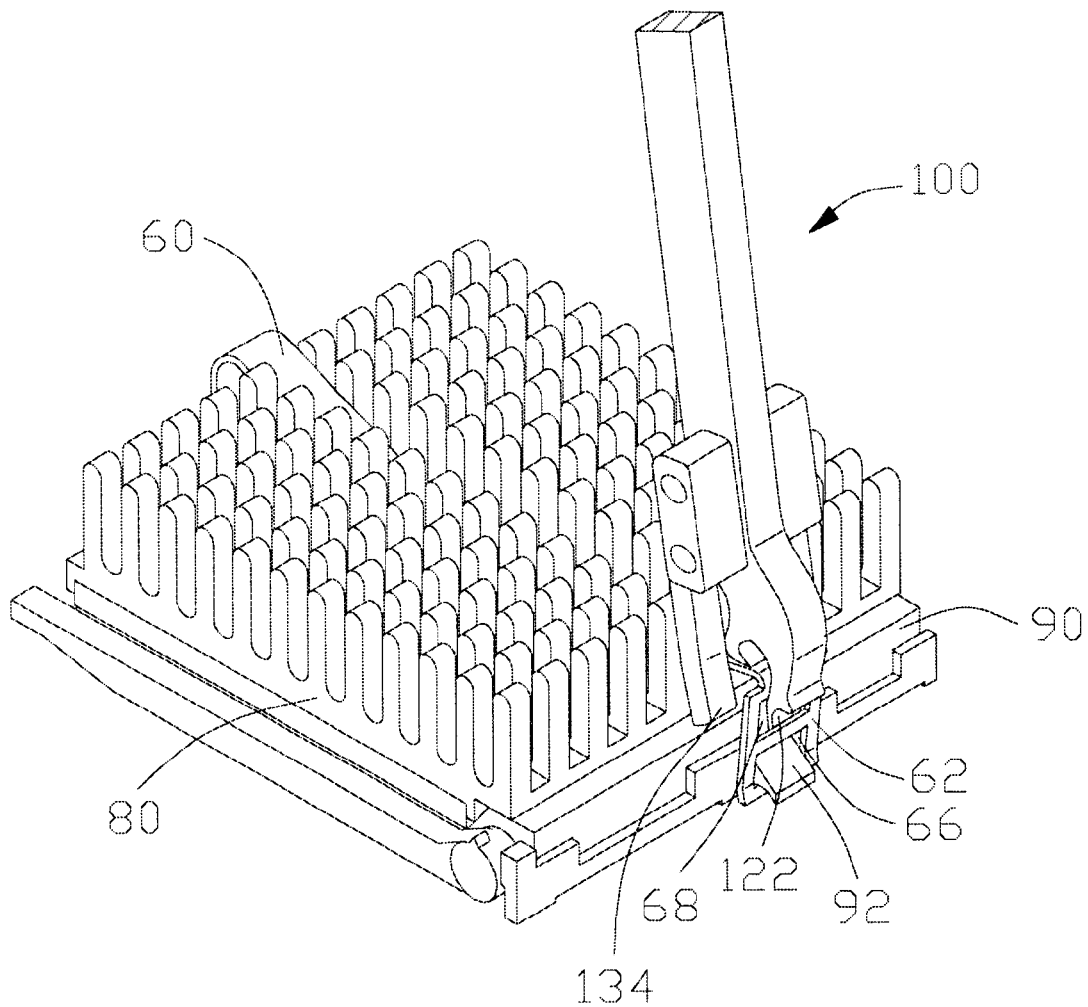
FIG. 5 is a completely assembled view of FIG. 3.
Figure 6:
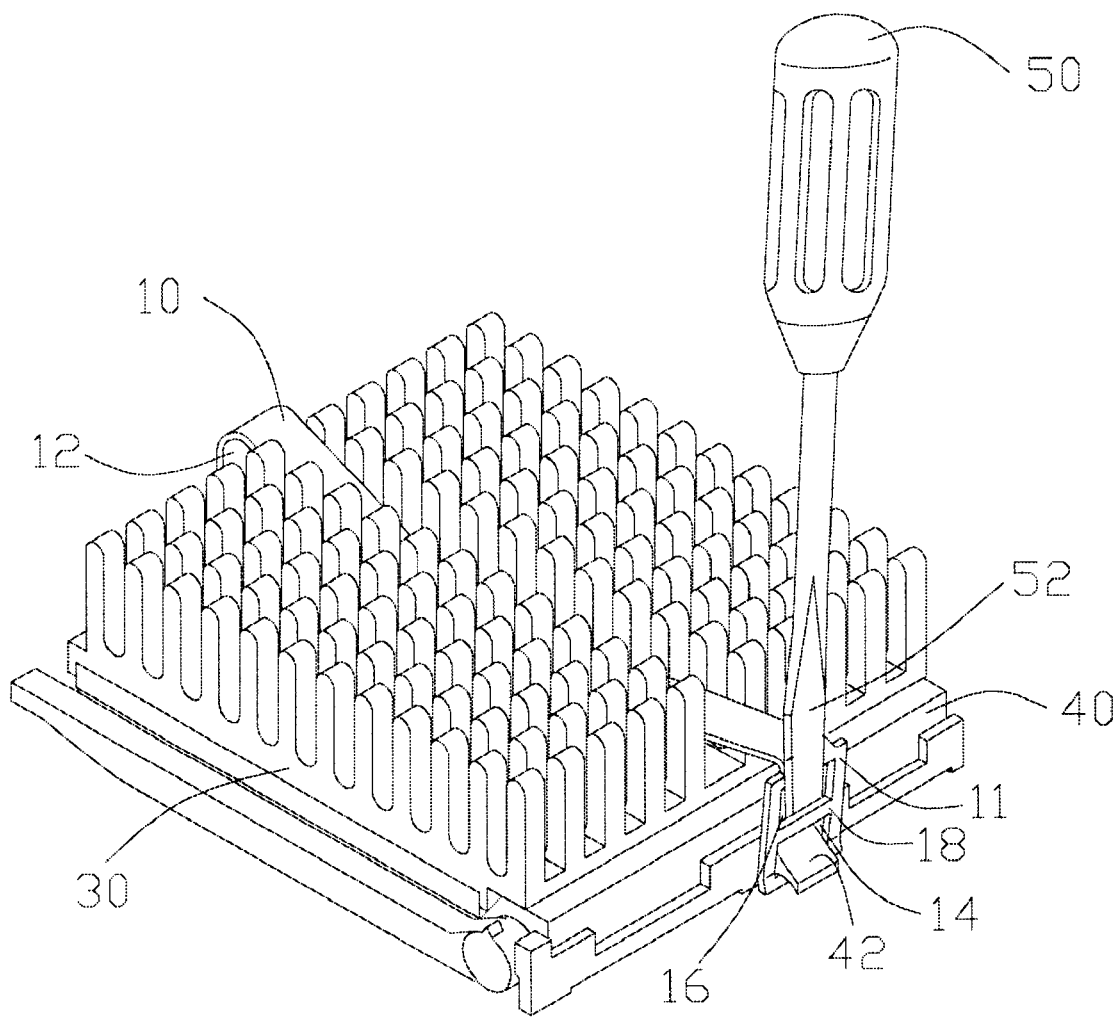
FIG. 6 is a perspective view of a conventional tool mounting a clip to a CPU socket on which a heat sink is mounted.

FIGS. 3–5 show the tool 100 of the present invention mounting a clip 60 to a CPU socket 90 on which a heat sink 80 is mounted.

The socket 90 has a pair of catches 92 on opposite sides thereof. The clip 60 comprises a first leg 62, and a second leg 64. Each leg 62, 64 defines a first opening 66 corresponding to the catch 92 of the socket 90. The first leg 62 further defines a second opening 68 above the first opening 66. A bar 70 is thus formed between the first opening 66 and the second opening 68 of the first leg 62.

In use of the tool 100, the opening 66 of the second leg 64 of the clip 60 is engaged with the corresponding catch 92 (not shown) of the socket 90. The tool 100 is then placed over the first leg 62 of the clip 60, with ends of the toes 134 of the tool 100 abutting the socket 90. The presser 114 of the tool 100 abuts the clip 60 near the top end 74 of the first leg 62. The claw 120 of the tool 100 catches the bar 70 of the first leg 62, with the hook 122 of the tool 100 entering the second opening 68. Using the handle 112, the tool 100 is then rotated in direction B about the ends of the toes 134 abutting the socket 90. The presser 114 downwardly presses the clip 60, and the claw 120 outwardly pushes the bar 70 to outwardly rotate the first leg 62 about the top end 74 thereof. Thus the first leg 62 is moved downwardly and rotated outwardly, and the clip 60 elastically deforms accordingly. Once the opening 66 of the first leg 62 has slid over the corresponding catch 92 of the socket 90, rotation of the tool 100 is stopped. The clip 60 elastically deforms part of the way back toward its original shape, and thereby causes the first leg 62 to engage with the catch 92 (see FIG. 5). Thus the clip 60 is readily engaged with the socket 90, securing the heat sink 80 on the socket 90.

In the present invention, the feet 130 of the tool 100 abut the socket 90 during the entire process of rotation of the tool 100, thereby minimizing the risk of the tool 100 accidentally striking a motherboard on which the socket 90 is mounted.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A tool for mounting a clip to a socket, the clip having a leg with a bar, the tool comprising:

a body having an elongate handle, a presser extending from a lower end of the handle and adapted for downwardly pressing the clip, and a finger extending from said lower end of the handle, the finger opposing and spacing from the presser, the finger being adapted for exerting force on the bar of the clip; and at least one foot having a connect portion attached to the body adjacent to and above said lower end of the handle and a toe depending from said connect portion adapted to abut the socket thereby allowing the body to be rotated about the socket, wherein
   the body is rotatable about a bottom end of said toe of the at least one foot to thereby cause the presser to downwardly press the leg and the finger to outwardly push the bar.

2. The tool as claimed in claim 1, wherein the body further comprises a handle.

3. The tool as claimed in claim 1, wherein the body defines at least one first hole, each foot defines at least one second hole, and each second hole of each foot corresponds to one first hole, and wherein a pin is retained in each first hole and all second holes corresponding to each first hole, thereby attaching all feet to the body.

4. The tool as claimed in claim 3, wherein each foot comprises a connection, portion in which the at least one first hole is defined, and a toe depending from the connection portion adapted to abut the socket.

5. The tool as claimed in claim 1, wherein the finger has a claw for catching the bar of the clip.

6. The tool as claimed in claim 3, wherein the body defines a pair of spaced first holes near said lower end of the handle, each foot defines a pair of second holes corresponding to the first holes respectively, and a pair of pins is respectively retained in the first holes and the second holes.

7. A tool mounting a clip to a socket, the socket having a catch on one side thereof, the clip having a leg defining an opening and a bar above the opening, the tool comprising:

a body having an elongate handle, a presser extending from a lower end of the handle and abutting about a top end of the leg, and a finger extending from the lower end, the finger opposing and spacing from the presser, the finger having a claw in a free end thereof catching the bar; and a foot comprising a first end attached to the handle near said lower end of the handle, and a second end abutting the socket; wherein
   the body is rotatable about the second end to cause the presser to downwardly press the leg and the claw to outwardly push the bar to thereby enable the catch to engage in the opening of the clip.

8. The tool as claimed in claim 7, wherein the body defines a pair of spaced first holes near said lower end of the handle, the first end of the foot defines a pair of second holes, and a pair of pins is respectively retained in the first holes and the second holes.

9. The tool as claimed in claim 7, wherein the leg further comprises an opening above the bar, and the claw comprises a hook entering the opening above the bar.

10. In combination, a socket with a chip thereon;

a heat sink seated upon the chip;

a clip pressing the heat sink against the chip, said clip including opposite downwardly extending first and second legs at two ends thereof, each of said first and second legs including a first opening engaged with a corresponding catch on the socket, the first leg further including a second opening above the corresponding first opening; and a tool including a body including a handle, and a presser around a bottom portion, and a finger located around said presser and above said bottom portion; wherein
   when assembling, the presser presses downwardly the clip, and the finger inserted into the second opening and rotated to deflect the first leg outwardly for easy engagement between the first opening of the first leg and the corresponding catch.

11. The combination s claimed in claim 10, wherein said tool further includes a pair of feet by two sides of the body to engage with at least one of said heat sink and said socket when assembling.

* * * * *